(12) United States Patent
Allen et al.

(10) Patent No.: US 8,470,516 B2
(45) Date of Patent: *Jun. 25, 2013

(54) METHOD OF FORMING A RELIEF PATTERN BY E-BEAM LITHOGRAPHY USING CHEMICAL AMPLIFICATION, AND DERIVED ARTICLES

(75) Inventors: Robert D. Allen, San Jose, CA (US); Luisa Bozano, Los Gatos, CA (US); Phillip Brock, Sunnyvale, CA (US); Qinghuang Lin, Yorktown Heights, NY (US); Alshakim Nelson, Fremont, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 808 days.

This patent is subject to a terminal disclaimer.

(21) Appl. No.: 12/542,821

(22) Filed: Aug. 18, 2009

(65) Prior Publication Data

US 2011/0045387 A1 Feb. 24, 2011

Related U.S. Application Data

(63) Continuation-in-part of application No. 11/750,356, filed on May 18, 2007, now Pat. No. 7,867,689.

(51) Int. Cl.
  *G03F 7/00* (2006.01)
  *G03F 7/26* (2006.01)
(52) U.S. Cl.
  USPC .......................................................... 430/306
(58) Field of Classification Search
  USPC .......................................................... 430/306
  See application file for complete search history.

(56) References Cited

U.S. PATENT DOCUMENTS

| 4,371,605 A | 2/1983 | Renner |
| 5,538,818 A | 7/1996 | Kamon |
| 5,789,460 A | 8/1998 | Harkness et al. |
| 6,087,064 A | 7/2000 | Lin et al. |

(Continued)

OTHER PUBLICATIONS

Office Action (Mail Date Oct. 30, 2008) for U.S. Appl. No. 11/789,902, filed Apr. 25, 2007; Confirmation No. 1934.

(Continued)

*Primary Examiner* — Cynthia Kelly
*Assistant Examiner* — Chanceity Robinson
(74) *Attorney, Agent, or Firm* — Cantor Colburn LLP

(57) ABSTRACT

A method of generating a relief pattern comprises disposing a resist composition on a substrate to form a film, the resist composition comprising a first silsesquioxane polymer of the formula (1):

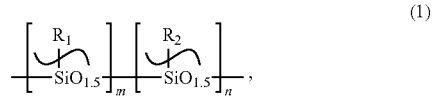

a second silsesquioxane polymer of the formula (2):

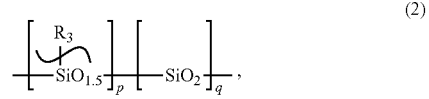

and
a photosensitive acid generator; patternwise exposing the film by e-beam lithography; heating the exposed film to effect crosslinking of the first polymer and second polymer in the exposed area; and developing the exposed film to form a negative relief pattern.

17 Claims, 3 Drawing Sheets

U.S. PATENT DOCUMENTS

| | | |
|---|---|---|
| 6,187,505 B1 | 2/2001 | Lin et al. |
| 6,613,834 B2 | 9/2003 | Nakata et al. |
| 6,703,181 B1 | 3/2004 | Hayashi et al. |
| 6,743,885 B2 | 6/2004 | Yahagi et al. |
| 6,967,222 B2 | 11/2005 | Khanarian et al. |
| 6,992,115 B2 | 1/2006 | Hawker et al. |
| 7,041,748 B2 | 5/2006 | Lin et al. |
| 7,056,840 B2 | 6/2006 | Miller et al. |
| 7,072,563 B2 | 7/2006 | Shelnut et al. |
| 7,072,565 B2 | 7/2006 | Shelnut et al. |
| 7,261,992 B2 | 8/2007 | Sooriyakumaran et al. |
| 7,261,994 B2 | 8/2007 | Hosono et al. |
| 7,318,992 B2 | 1/2008 | Kawana et al. |
| 7,355,384 B2 | 4/2008 | Faust |
| 7,361,444 B1 | 4/2008 | Angelopoulos et al. |
| 7,399,581 B2 | 7/2008 | Allen et al. |
| 2004/0137241 A1* | 7/2004 | Lin et al. ............ 428/447 |
| 2004/0229158 A1 | 11/2004 | Meador et al. |
| 2005/0221225 A1 | 10/2005 | Kawana et al. |
| 2006/0105181 A1 | 5/2006 | Lin et al. |
| 2007/0009828 A1 | 1/2007 | Tamura et al. |
| 2008/0150091 A1 | 6/2008 | Lin |
| 2008/0286467 A1 | 11/2008 | Allen et al. |

OTHER PUBLICATIONS

Watanabe et al., "Silicon-containing Resist for Phase-Shifting Masks," J. Vac Sci. Technol. B 1991, 9, 3436.

Sakata et al., "A Novel Electron Beam Resist System—Acid Catalyzed Conversion of p(Di-t-Butoxysiloxane) into Glass," J. Photopolym. Sci. Technol. 1992, 5, 181.

Namatsu et al., "Three Dimensional Siloxane Resist for the Formation of Nanopatterns with Minimum Linewidth Fluctuations," J. Vac. Sci. Technol. B 1998, 16, 69.

Medeiros et al., "Recent Progress in Electron-Beam Resists for Advanced Mask-Making," IBM J. Res. Dev. 2001, 45, 63.

Office Action—Final (Mail Date Apr. 15, 2010) for U.S. Appl. No. 11/750,356, filed May 18, 2007; Confirmation No. 9941.

* cited by examiner

METHOD OF FORMING A RELIEF PATTERN BY E-BEAM LITHOGRAPHY USING CHEMICAL AMPLIFICATION, AND DERIVED ARTICLES

CROSS REFERENCE TO RELATED APPLICATIONS

This application is a Continuation-In-Part Application of U.S. patent application Ser. No. 11/750,356, filed May 18, 2007, the contents of which are incorporated herein by reference in their entirety.

BACKGROUND

This disclosure relates to a method of forming a relief pattern by e-beam lithography using chemical amplification, and derived articles.

E-beam lithography using chemically amplified resists plays an important role in the fabrication of masks. There has been increasing interest in optimizing the properties of these chemically amplified resists for mask applications. In addition to the stability of the resist formulation, speed, sensitivity, resolution and line-edge roughness (LER) are also critical parameters. The resists are usually spun on the top of a 15 nanometer chromium (Cr) layer and need to have good etch properties to better transfer the pattern onto the metal layer. The etch rate, and isotropy (or anisotropy) determine the required film thickness. Higher etch rates require a thicker film, while a lower rate can work with a thinner resist film. Additionally, resists that operate over a range of post exposure bake temperatures are desirable. It is generally important that the bake temperatures are not too high and that the critical dimension (CD) varies minimally with small temperature fluctuations.

In view of the state of the prior art, it is desirable to develop new e-beam resists with high resolution, high sensitivity, and good profile control for generating patterns for use in mask fabrication. In particular, silicon-containing resists are desirable since increased silicon content improves the etch contrast between the patterned layer and the underlying substrate.

BRIEF SUMMARY

A method of generating a relief pattern comprises: disposing a resist composition on a substrate to form a film, the resist composition comprising:
a first silsesquioxane polymer of the formula (1):

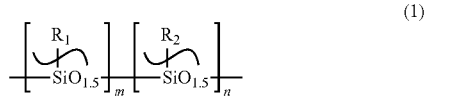

(1)

wherein m is an integer greater than zero, n is an integer greater than or equal to zero, $R_2$ is a carbon functional group containing at least one carbon atom, and $R_1$ is selected from the group consisting of

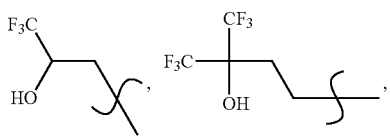

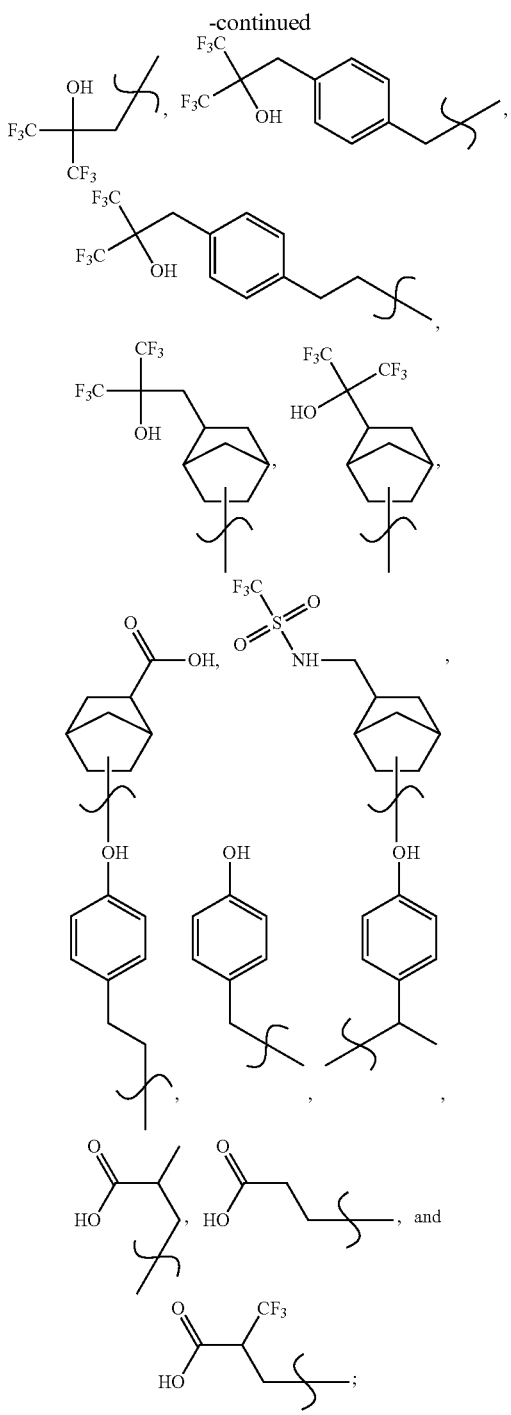

a second silsesquioxane polymer of the formula (2):

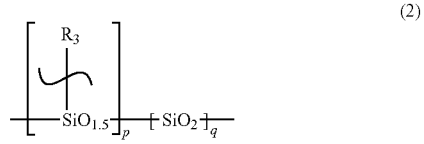

(2)

wherein R₃ is a functional group comprising at least one carbon atom, p is an integer greater than zero, and q is an integer greater than or equal to zero; and a photosensitive acid generator;

patternwise exposing the film by e-beam lithography;

heating the exposed film to effect crosslinking of the first polymer and second polymer in the exposed area; and developing the exposed film to form a negative relief pattern.

A mask for an integrated circuit device, the mask comprising a layer comprising a relief pattern, the relief pattern derived from e-beam lithography of a negative working resist composition, the resist composition comprising:

a first silsesquioxane polymer of the formula (1):

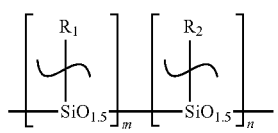

(1)

wherein m is an integer greater than zero, n is an integer greater than or equal to zero, R₂ is a carbon functional group containing at least one carbon atom, and R₁ is selected from the group consisting of

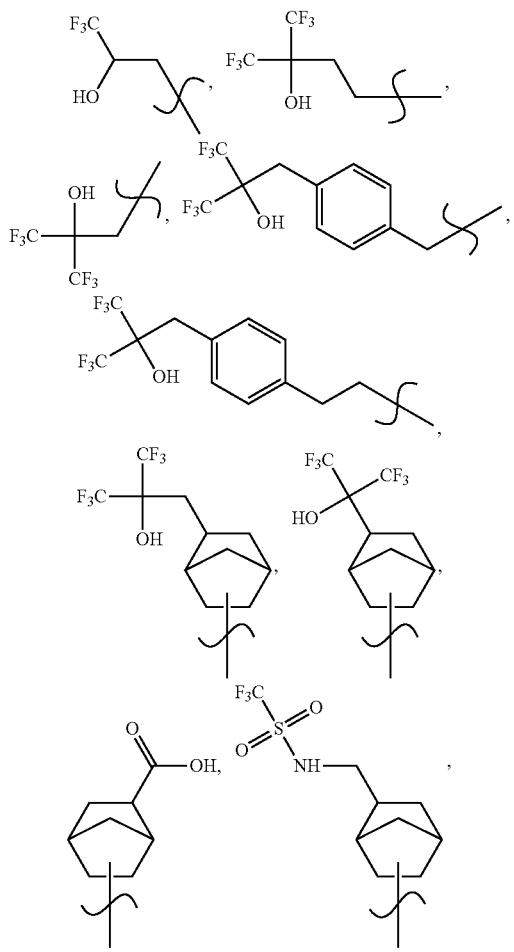

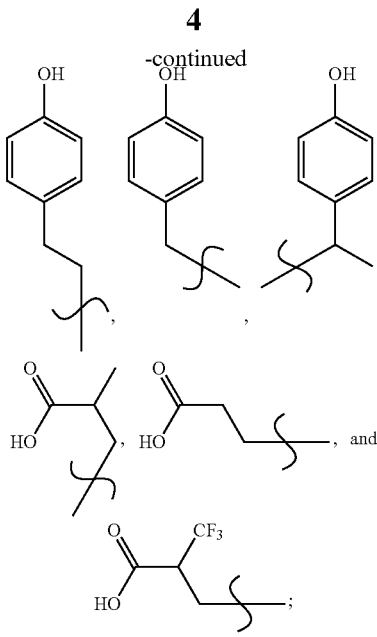

a second silsesquioxane polymer of the formula (2):

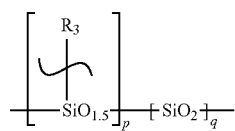

(2)

wherein R₃ is a functional group comprising at least one carbon atom, p is an integer greater than zero, and q is an integer greater than or equal to zero; and a photosensitive acid generator.

DETAILED DESCRIPTION

Figure 1:
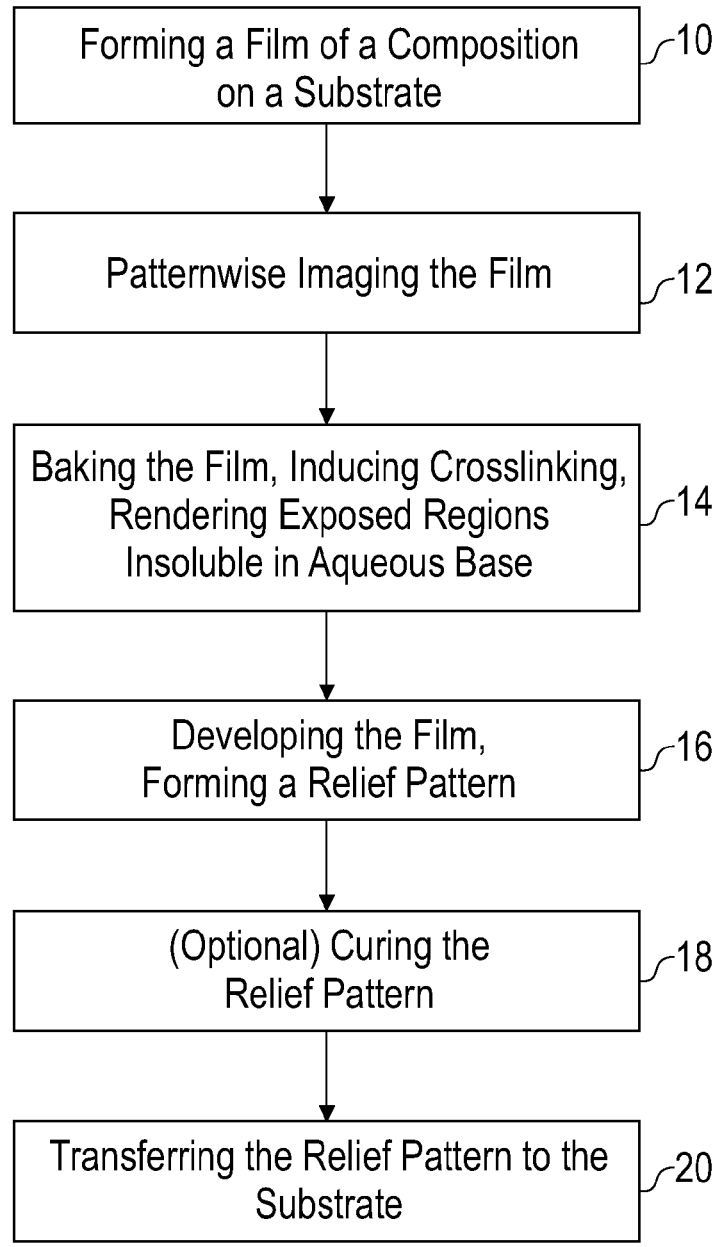
FIG. 1 is a flow chart illustrating the method for preparing a relief pattern.

Disclosed is a method of forming a relief image using negative tone e-beam sensitive silicon-containing resist compositions. The resist compositions are suitable for multilayer lithographic processes used in fabricating masks. The resist composition comprises a blend of two or more silsesquioxane polymers and a photoacid generator. At least one of the polymers possesses acid-sensitive functional groups, such as silanols, that in the presence of photo-released acid condense to form Si—O—Si bonds. Chemical amplication results from one molecule of a photogenerated acid catalyzing the formation of many Si—O—Si bonds. The relief patterns formed with the resist composition offer significant etch contrast as a result of the high silicon content, enabling the facile transfer of the pattern to an underlying substrate.

The at least two silsesquioxane polymers may be soluble in aqueous base or organic solvents. Blending of materials can allow properties such as dissolution rate and aqueous base solubility to be appropriately adjusted. At least one of the silsesquioxane polymers possesses acid-sensitive functional groups (such as silanol end groups, for example) which can undergo condensation reactions in the presence of acid to form Si—O—Si bonds. The silsesquioxane polymers may undergo photo-acid catalyzed crosslinking, thermally induced crosslinking, or a combination of these, by condensation of silanol end groups, for example. The resist composition can further comprise an organosilicate, another silsesquioxane, a siloxane, and the like, that may be soluble in aqueous base or organic solvents.

In one embodiment, the silsesquioxane polymers in the blend are miscible. Herein, a miscible blend has a single glass transition temperature (Tg) that is dependent upon the weight ratio of the first and second silsesquioxane polymers.

The first silsesquioxane polymer can be a linear compound, branched compound, caged compound, or combinations thereof, and has the following general structural formula (I):

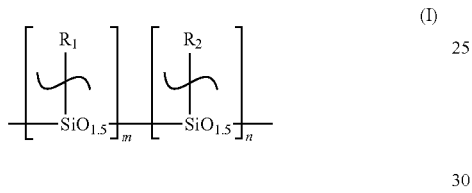

(I)

wherein m and n represent the number of repeating units, $R_1$ may comprise one or more functional groups that provide polymer solubility in aqueous base, and $R_2$ represents a carbon functional group containing at least one carbon atom, for controlling polymer dissolution in aqueous base. Subscript m is an integer greater than zero, and subscript n is an integer greater than equal to zero. $R_1$ is not the same as $R_2$. In one embodiment, m and n are integers greater than zero.

$R_1$ is not limited to any specific functional group, and can be selected from among linear or branched alkyls substituted with OH, C(O)OH, and/or F; cycloalkyls substituted with OH, C(O)OH, and/or F; aromatics substituted with OH, C(O)OH, and/or F; arenes substituted with OH, C(O)OH, and/or F; acrylics substituted with OH, C(O)OH, and/or F; and combinations of the foregoing groups. For example, $R_1$ can be

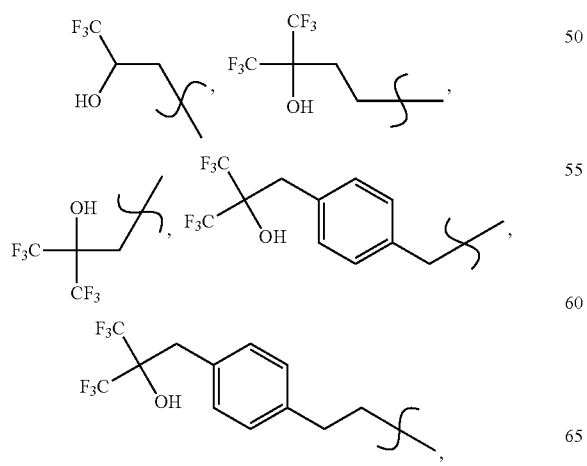

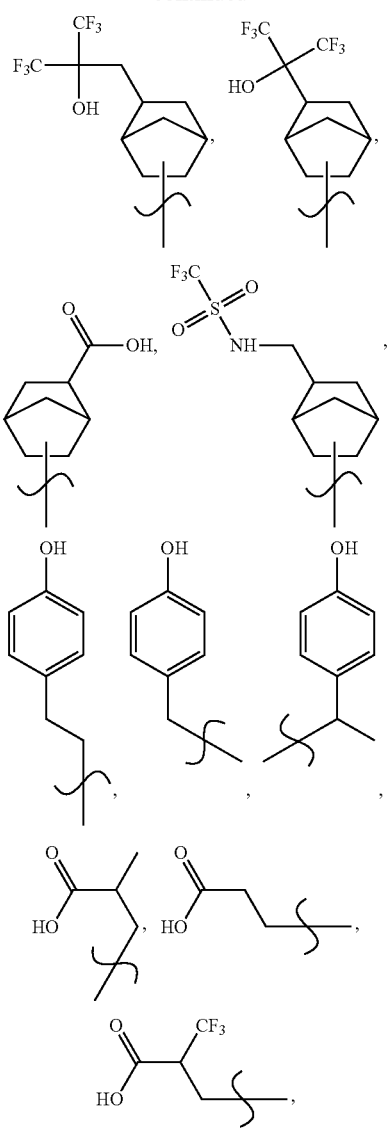

or the like.

$R_2$ is not necessarily limited to any specific functional group, and may comprise linear or branched alkyls, cylcoalkyls, aromatics, arenes, acrylates, or combinations thereof. For example $R_2$ may be:

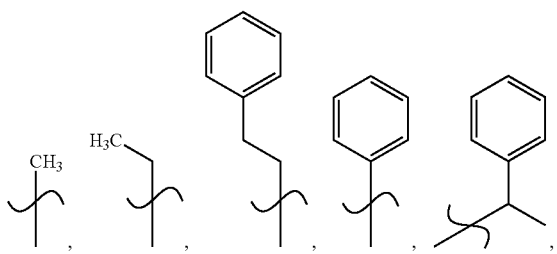

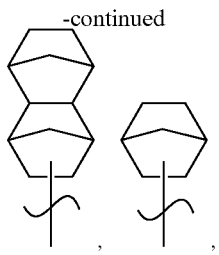
, , or the like.

The $R_1$ and $R_2$ proportions and structures may be selected to provide a material suitable for photolithographic patterning processes.

The second silsesquioxane polymer has the structural formula (2):

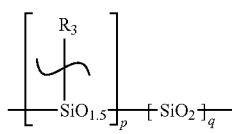

(2)

wherein $R_3$ may be a functional group selected from alkyls, cycloalkyls, aryl, or combinations thereof. For example, $R_3$ may be:

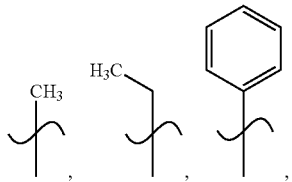
, , , or the like.

Subscript p is an integer greater than zero, and subscript q is zero or an integer greater than zero. In one embodiment, the second silsesquioxane polymer is poly(methylsilsesquioxane), where $R_3$ is a methyl group, and p is an integer from about 4 to about 1,000, and q is zero. In one embodiment, p and q are integers greater than zero. Subscript p may also be greater than 1,000. The second silsesquioxane polymer structure can be caged, linear, branched, or combinations thereof.

The first and second silsesquioxane polymers comprise end groups selected from silanols, halosilanes, acetoxysilanes, silylamines, alkoxysilanes, or combinations thereof, which may undergo condensation reactions in the presence of an acid generated by a photoacid generator under sufficient exposure to radiation, followed by thermal baking at sufficient temperature, to effect polymer crosslinking. The second polymer can undergo crosslinking with molecules of the first polymer, the second polymer, or a combination of these. In one embodiment, the second silsesquioxane polymer may be the methylsilsesquioxane polymer LKD 2021 or LKD-2056 (products of JSR Corporation) which contain silanol end groups.

The silsesquioxane polymers in the polymer blend can have a weight averaged molecular weight in the range from about 400 to about 500,000 g/mol, more particularly from about 1,500 to about 10,000 g/mol. The proportions and structures are selected to provide a material suitable for photolithographic processes.

The resist composition further comprises a photosensitive acid generator (PAG). Upon exposure to radiation, the PAG generates a strong acid. Generally, the PAG has a high thermal stability, particularly to temperatures greater than 140° C. so they are not degraded during pre-exposure processing. The photosensitive acid generator can be miscible with the two polymers. Examples of PAGs include, without limitation, (trifluoro-methylsulfonyloxy)-bicyclo[2.2.1]hept-5-ene-2,3-dicarboximide (MDT), N-hydroxy-naphthalimide (DDSN), onium salts, benzoin tosylate, t-butylphenyl α-(p-toluenesulfonyloxy)-acetate, t-butyl α-(p-toluenesulfonyloxy)-acetate, and sulfonic acid esters of N-hydroxyamides, imides, or combinations thereof. Onium salts include halogen complex anions of divalent to heptavalent metals or non-metals, for example, Sb, B, P, and As. Other examples of onium salts include aryl-diazonium salts, halonium salts, aromatic sulfonium salts, aromatic sulfoxonium salts, and selenium salts (e.g., triarylsulfonium and diaryliodonium hexafluoroantimonates, hexafluoroarsenates, trifluoromethanesulfonates, and others).

Other photosensitive acid generators include the family of nitrobenzyl esters and the s-triazine derivatives. S-triazine acid generators are disclosed, for example, in U.S. Pat. No. 4,189,323. Still other acid generators include N-camphorsulfonyloxynaphthalimide, N-pentafluorophenylsulfonyloxynaphthalimide, ionic iodonium sulfonates, e.g., diaryl iodonium (alkyl or aryl)sulfonate and bis-(di-t-butylphenyl) iodonium camphanylsulfonate, perfluoroalkanesulfonates, such as perfluoropentanesulfonate, perfluorooctanesulfonate, perfluoromethanesulfonate; aryl (e.g., phenyl or benzyl)triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, α,α'-bis-sulfonyl-diazomethanes; sulfonate esters of nitro-substituted benzyl alcohols; naphthoquinone-4-diazides; and alkyl disulfones. Still other photoacid generators are disclosed in Reichmanis et al. (1991), Chemistry of Materials 3:395, and in U.S. Pat. No. 5,679,495 to Yamachika et al. Additional suitable acid generators useful in conjunction with the compositions and methods of the invention will be known to those skilled in the art and/or are described in the pertinent literature. In one embodiment the photoacid generator is triphenylsulfonium nonaflate.

The first and second silsesquioxane polymers can each be present in the resist composition in an amount from about 1 wt % (weight percent) to about 99 wt % based on the total weight of the polymers of the resist composition. For example, the first polymer can be present in an amount of 5 wt % to about 95 wt %, more particularly about 20 wt % to about 80 wt %, and even more particularly 50 wt % to about 70 wt % based on the total weight of the polymers of the resist composition. The acid sensitive second silsesquioxane polymer of formula 2, a polymer that will crosslink in the presence of acid, can be present in an amount from about 5 wt % to about 95 wt %, more particularly about 20 wt % to about 80 wt %, and even more particularly 30 wt % to about 60 wt % based on the total weight of the polymers of the resist composition.

The photoacid generator is present in the resist composition in an amount of from about 0.5 wt % to about 20 wt %, more particularly about 3 wt % to about 15 wt %, based on the total weight of the polymers of the resist composition. The resist composition can comprise more than one photoacid generator.

The resist composition can further optionally comprise an organic crosslinking agent, such as methylphenyltetramethoxymethyl glycouril, tetramethoxymethyl glycouril (available under the trade name POWDERLINK® by CYTEC TECHNOLOGY CORPORATION, methylpropyltetramethoxymethyl glycouril, or 2,6-bis(hydroxymethyl)-p-cresol. Photobase generators can also be used for crosslinking silanol polymers.

A casting solvent can be used to prepare a film of the resist composition. Exemplary casting solvents include ethoxyethylpropionate (EEP), a combination of EEP and gamma-butyrolactone, propylene-glycol monomethylether alcohol and acetate, propyleneglycol monopropyl alcohol and acetate, ethyl lactate, or combinations thereof. When a solvent is present, the resist composition contains about 50 to about 98 wt. % solvent based on total weight of the resist composition.

In optimizing the photolithography process, the resist composition can optionally further comprise minor amounts of auxiliary components such as dyes/sensitizers and an organic base. The base can be any base in the resist art, with the proviso that the desirable properties of the coated films, such as crosslinking and developability are not adversely affected. Non-limiting examples of bases include tetraalkylammonium hydroxides such as tetrabutyl ammonium hydroxide (TBAH), cetyltrimethylammonium hydroxide, 1,8-diaminonaphthalene, or a combination of these. The base additive, when used, is present in an amount of about 1 wt. % or less based on the total weight of the polymers of the composition.

Several more specific embodiments of the resist composition are also disclosed. In one embodiment, the resist composition consists essentially of the above-described first and second silsesquioxane polymers, a photoacid generator, and a solvent. In another, the resist composition consists essentially of the above-described first and second silsesquioxane polymers, a photoacid generator, a solvent, and an organic base. In still another embodiment, the resist composition consists essentially of the above-described first and second silsesquioxane polymers, a photoacid generator, a solvent, and an organic base, and does not contain a crosslinking agent.

The method of forming a relief pattern on a substrate with the resist composition is depicted schematically in the flow chart of FIG. 1. In first step 10, a film of the resist composition is formed on a substrate, the resist composition comprising a blend of the two silsesquioxane polymers and a photosensitive acid generator as described above. The film is formed by processes such as spin coating, spray coating, dip coating, doctor blading, and the like, which can be used individually and in combinations thereof. Substrates can be ceramic, metallic or semiconductive. The substrate may comprise materials of the Group I, II, III, and IV elements, plastic material, silicon dioxide, glass, fused silica, silicon nitride, silicon oxynitride, mica, ceramic, or combinations thereof. The substrates can further comprise metals deposited on the aforementioned substrates. For example, a substrate may comprise a prepared silicon wafer substrate such as those employed in semiconductor manufacturing. The film may be disposed on top of the substrate or may be integrally joined with the substrate. The substrate may or may not be coated with an organic anti-reflective layer prior to deposition of the resist composition.

Figure 3:
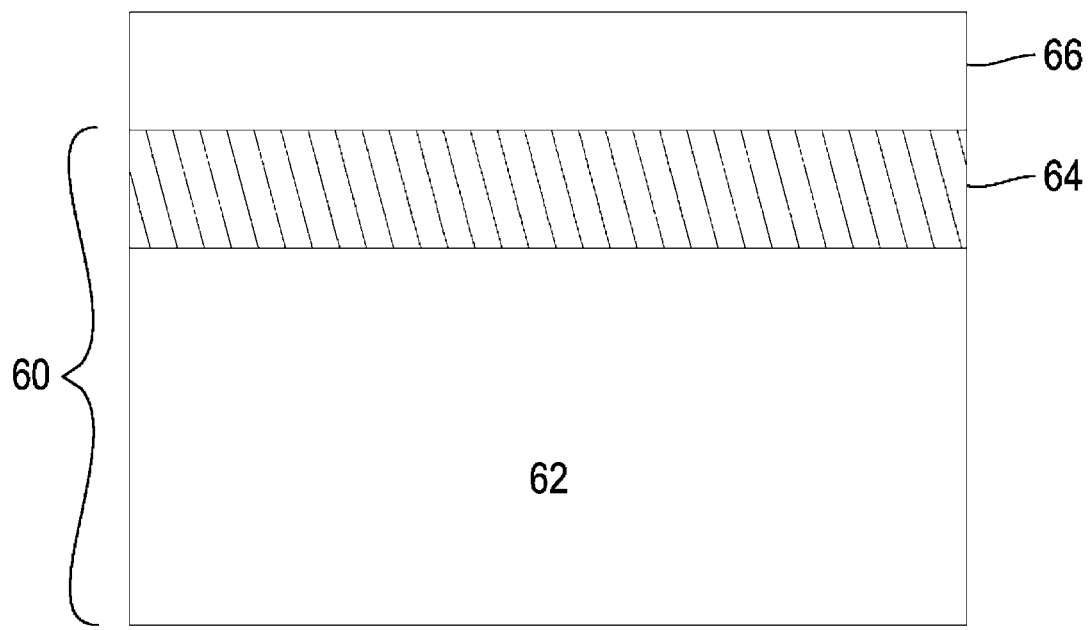
FIG. 3 is a schematic layer structure showing a film of the resist composition disposed on a bilayer substrate.

A bilayer substrate, shown schematically in FIG. 3 as 60, can be employed, wherein a resist composition forms an upper resist layer 66 (i.e., the imaging layer) on top of a bilayer substrate 60 comprised of a base layer 62 and underlayer 64 that lies between the upper resist layer 66 and the base layer 62. The base layer of the bilayer substrate is comprised of a suitable substrate material, and the underlayer of the bilayer substrate is comprised of a material that is highly absorbing at the imaging wavelength and compatible with the imaging layer. Conventional underlayers include crosslinked poly(hydroxystyrene), polyesters, polyacrylates, fluorinated polymers, cyclic olefin polymers and the like, including diazonapthoquinone (DNQ)/novolak resist material.

Referring again to FIG. 1, before the cast film has been exposed to radiation, the film is given a post apply bake (PAB) at 90° C. to 160° C. for a short period of time, typically on the order of about 1 minute. The dried film has a thickness of about 0.01 to about 5.0 micrometers, preferably about 0.02 to about 2.5 micrometers, more particularly about 0.05 to about 1.0 micrometers, and most particularly about 0.10 to about 0.20 micrometers.

In second step 12 of FIG. 1, the film is imaged patternwise using a radiation source, resulting in the photosensitive acid generator producing an acid catalyst in the exposed regions of the film.

Figure 2:
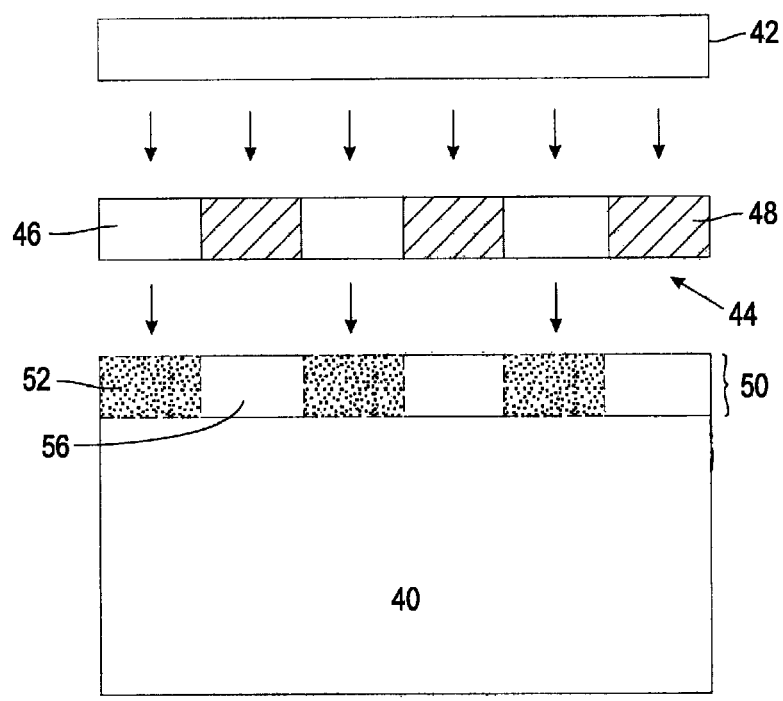
FIG. 2 is an illustration of patternwise imaging in accordance with the disclosed method.

FIG. 2 is an illustration of patternwise imaging, wherein a radiation source 42 projects radiation through a patterned mask 44 onto a film 50 disposed on a substrate 40. The mask may have a pattern of masked sections 48 which are substantially opaque to the radiation, and unmasked sections 46 which are substantially transparent to the radiation. Radiation passing through the unmasked sections 46 may be transmitted to the film 50 to be absorbed in the exposed regions 52 of the film 50, wherein the radiation may induce the production of an acid catalyst in the exposed regions 52 of the film 50. Unexposed regions 56 may not produce an acid catalyst. Exposure to the radiation (such as ultraviolet (UV) light at a wavelength from about 12 nm to about 1000 nm, electron beam radiation, plasma, etc.) followed by a post exposure bake may render the exposed regions 52 insoluble in a developer. In particular, the film is exposed using an electron beam source.

Referring again to FIG. 1, in third step 14, the exposed film is post exposure baked, which may induce crosslinking in the exposed regions of the film, rendering the exposed regions insoluble in aqueous base (negative working). Crosslinking of the functional groups (such as silanol end groups) to form interpenetrating lattices may increase the integrity of the patterned features following UV-thermal treatment. The post-exposure bake temperature of step 14 may be in the range from about 50° C. to about 200° C.

In fourth step 16, the film is developed and the base-soluble unexposed regions of the film may be removed from the film to leave a relief pattern remaining from the exposed, crosslinked regions of the film. The developer may be organic or aqueous based, such as an alkaline aqueous developer.

In optional fifth step 18, the relief pattern can be cured. Curing can include thermal treatment of at least 200° C. of the patterned and developed film, for example from about 300° C. to about 450° C. Curing may utilize thermal treatment, UV radiation, electron beam irradiation, plasma, or combinations of these techniques, such as for example thermal treatment in combination with UV radiation.

In sixth step 20, the relief pattern from the resist structure is transferred to the material of the underlying substrate. In coated or bilayer photoresists, this will involve transferring the pattern through the underlayer onto the base layer. In single layer photoresists the transfer will be made directly to the substrate. Typically, the pattern is transferred by etching with reactive ions such as oxygen, plasma, and/or oxygen/sulfur dioxide plasma using a plasma generating tool. Plasma tools include, but are not limited to, electron cyclotron resonance (ECR), helicon, inductively coupled plasma, (ICP) and transmission-coupled plasma (TCP) system. Etching techniques are well known in the art and one skilled in the art will be familiar with the various commercially available etching equipment.

The compositions and resulting resist structures can be used to create patterned material layer structures such as lines or holes for contacts or vias, as might be used in the design of masks for producing integrated circuit devices. Thus also disclosed is a mask for an integrated circuit device, the mask comprising a layer comprising a relief pattern, the relief pattern derived from e-beam lithography of a negative-working resist composition, the resist composition comprising:

a first silsesquioxane polymer of the formula (1):

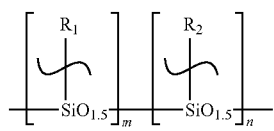

(1)

wherein m is an integer greater than zero, n is an integer greater than or equal to zero, $R_2$ is a carbon functional group containing at least one carbon atom, and $R_1$ is selected from the group consisting of

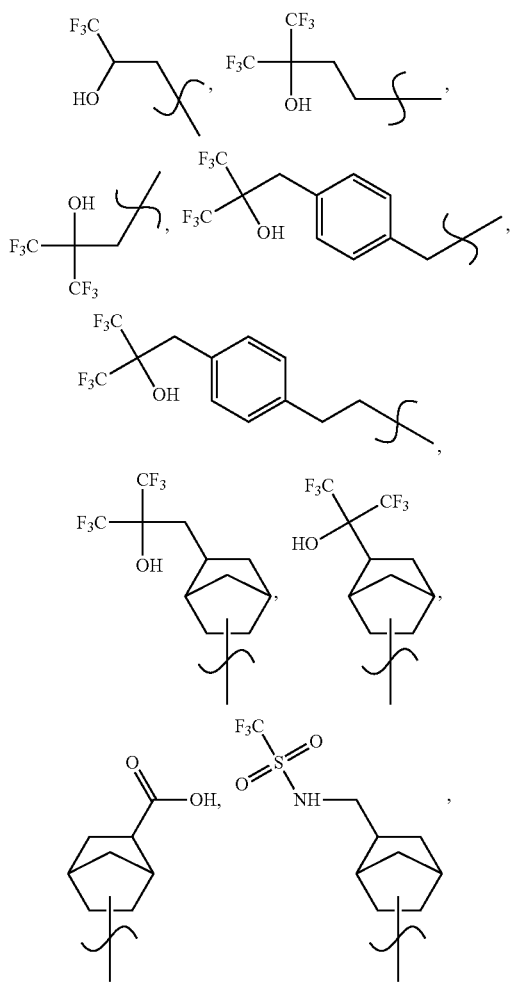

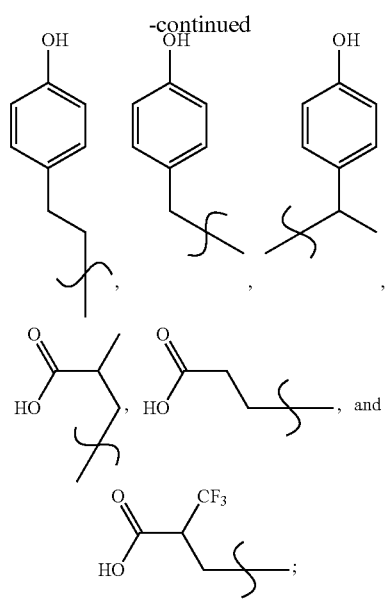

and a second silsesquioxane polymer of the formula (2):

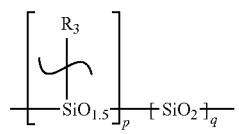

(2)

wherein $R_3$ is a functional group comprising at least one carbon atom, p is an integer greater than zero, and q is an integer greater than or equal to zero; and a photosensitive acid generator.

The following examples illustrate the preparation and use of the disclosed resist compositions in an electron beam application.

EXAMPLES

Where appropriate, the following techniques and equipment were utilized in the examples below: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./minute on a TA Instruments DSC 2920 modulated differential scanning calorimeter. Molecular weights were measured using gel permeation chromatography (GPC) in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26). Modulus and hardness data were acquired using a nanoindentation method. Nanoindentation was performed with a Nano Intender XP system (Nano Instruments Innovation Center), equipped with the Dynamic Contact Module (DCM). The DCM may provide an overall miniaturization of the XP system, which may make it more suitable to perform indentations in low force ranges, such as 0.01 millinewtons (mN) to 12 mN. The DCM machine used a Berkovitch indenter (angle 65.3°). The Continuous Stiffness Measurement (CSM) option was used.

E-beam exposures were made with a Leica VB6 VISTEC tool at 100 keV and a current of 0.5 nA/cm$^2$ was used. The tool has nominal spot size of 12 nm. The patterns were generated with L-EDIT CAD software, a layout editor for lithography sold by Tanner Research Inc., converted to GDS file format and finally fragmented by CATS pattern conversion software into a file readable by the pattern generator.

Example 1

Synthesis of Poly(4-hydroxy-α-methylbenzylsilsesquioxane-co-α-methylbenzylsilsesquioxane) (6:4 pHMBS/MBS)

A mixture of 1-trichlorosilyl-1-(4-acetoxyphenyl)-ethane (223.2 grams; 0.75 mole), 1-trichlorosilyl-1-phenyl-ethane (125.8 grams; 0.525.1 mole), and 389 grams (g) of anhydrous tetrahydrofuran were added drop-wise to a rapidly stirred mixture of triethylamine (307.7 g; 4.2075 mole) and 389 g of deionized water while cooling with an ice bath to maintain the reaction temperature between about 0° C. and about 10° C. After the addition was complete, the mixture was stirred at a temperature between about 0° C. and about 10° C., for one hour. The cooling bath was removed and the mixture was allowed to warm to room temperature and stir for about 20 hours. The reaction mixture was placed in a reparatory funnel and the lower layer was separated and retained. The upper layer was diluted with about 900 milliliters (ml) deionized water and extracted three times with about 450 ml of diethyl ether. The ether extracts were combined with the lower layer retained from the first separation and the ether solution washed four times with about 400 ml of about 2% aqueous hydrochloric acid, and three times with about 300 ml of saturated aqueous NaCl (brine). The ether solution was dried over anhydrous magnesium sulfate, filtered, and evaporated to yield 264.4 g of a hard foam product after drying under high vacuum to constant weight.

A 260 g portion of the dry foam was dissolved in about 260 g of toluene, heated to about 100° C. with stirring, 20 drops of about 50% w/w aqueous potassium hydroxide added, and the mixture heated to reflux under nitrogen while collecting azeotroped water in a Dean-Stark trap. After refluxing the reaction mixture for about 36 hours, the reaction temperature had increased from about 103.8° C. to about 110.4° C. GPC analysis of an aliquot taken from the reaction mixture indicated that the molecular weight was in the range of about 3,000 to about 3,500 grams/mole (g/mol). The reaction mixture was cooled and precipitated in about 10 liters of stirred hexanes, collected on a filter funnel and washed with 3×500 ml of hexanes. After drying to constant weight, about 220 g of solid was obtained.

The solid above was added portion-wise to a stirred mixture of 140 ml of aqueous ammonium hydroxide (12.4 N) in 1120 ml of methanol at about 50° C. The suspension was heated to reflux and became homogenous after about 20 minutes at reflux. The solution was refluxed for about 3 additional hours. The reaction solution was then cooled to about room temperature, and the polymer product was isolated by precipitation in a mixture of about 128.9 g of acetic acid and about 20 liters of deionized water. The solid product was isolated by filtration and washed with three approximately 1 liter portions of deionized water. Drying in a vacuum oven for several days at about 60° C. yielded 179 g of poly(HMBS/MBS) product.

Example 2 e-Beam Resist Composition

A negative tone resist composition was formulated with 3 g of a 20 wt % solution of 6:4 pHMBS/MBS, 2 g of a 20 wt % solution of LKD-2056 (from JSR Corporation), 48 mg of a first photosensitive acid generator nonaflate, 160 mg of a 20 wt % solution of triphenylsulfonium nonaflate in PGMEA, 0.22 g of a 0.5 wt % solution of an amine base, and 4 g of PGMEA. The resulting formulation was filtered through a 0.2 micrometer filter.

The formulation was spun onto a 5-inch silicon wafer pre-coated with DUV42P, an anti-reflectant available from Brewer Science, Inc. (63 nm thick) and then post-applied baked at 110° C. for 60 seconds. The baked film was exposed to e-beam irradiation (24 microCoulombs/cm$^2$) to generate a latent image and post exposure baked at 90° C. for 60 seconds, and then developed using a CD26 (2.4% tetramethylammonium hydroxide) aqueous developer for 60 s. The e-beam patterning process generated 40 nm lines with 120 nm pitch (LWR=5, LER=3.4).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of generating a relief pattern, comprising disposing a resist composition on a substrate to form a film, the resist composition comprising:

a blend of polymers consisting essentially of a first silsesquioxane polymer of the formula (1):

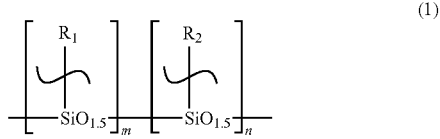

wherein m is an integer greater than zero, n is an integer greater than or equal to zero, $R_2$ is a carbon functional group containing at least one carbon atom, and $R_1$ is selected from the group consisting of

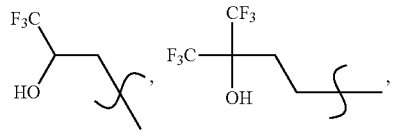

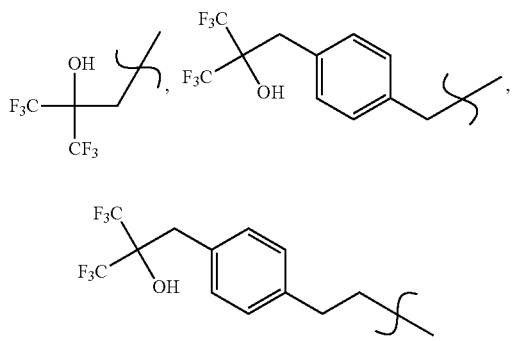

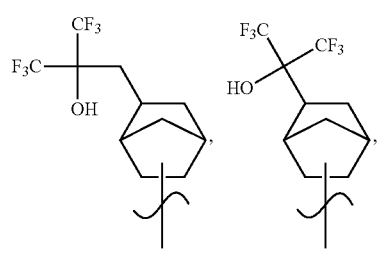

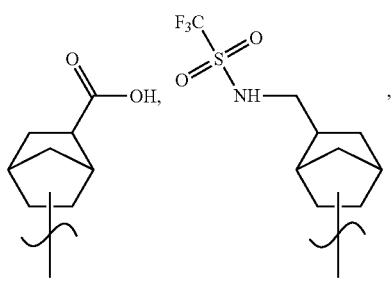

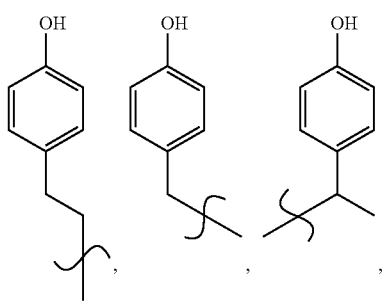

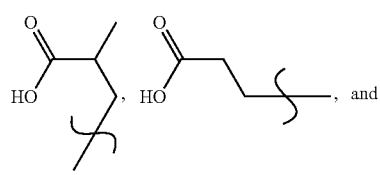

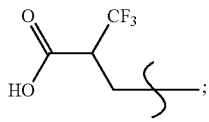

a second silsesquioxane polymer of the formula (2):

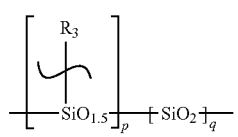

wherein $R_3$ is a functional group comprising at least one carbon atom, p is an integer greater than zero, and q is an integer greater than or equal to zero; and a photosensitive acid generator;
patternwise exposing the film by e-beam lithography;
heating the exposed film to effect crosslinking of the first polymer and second polymer in the exposed area; and
developing the exposed film to form a negative relief pattern.

2. The method of claim 1, further comprising transferring the negative relief pattern into the substrate after developing.

3. The method of claim 1, wherein the resist composition comprises about 30 wt % to about 95 wt % of the first polymer and about 5 wt % to about 70 wt % of the second polymer, based on total weight, excluding solvents, of the resist composition.

4. The method of claim 1, wherein the substrate comprises a base layer and an underlayer, and disposing is on the underlayer to form a bilayer structure.

5. The method of claim 1, wherein at least one of the first and second silsesquioxane polymers possesses an acid-sensitive functional group that undergoes a condensation reaction in the presence of acid to form Si—O—Si bonds.

6. The method of claim 1, further comprising curing the relief pattern after developing.

7. The method of claim 6, wherein said curing comprises exposing said relief pattern to UV radiation, heat, electron beam irradiation, plasma, or combinations thereof.

8. The method of claim 6, wherein said curing comprises curing said relief pattern at a temperature greater than 200° C.

9. The method of claim 1, wherein the first polymer and the second polymer form a miscible blend, wherein the miscible blend has a single Tg that is dependent on a weight ratio of the first polymer and the second polymer.

10. The method of claim 1, wherein $R_2$ is selected from the group consisting of branched alkyls, cycloalkyls, aromatics, arenes, acrylates, and combinations thereof.

11. The method of claim 10, wherein $R_2$ is selected from the group consisting of

13. The method of claim 1, wherein $R_3$ is selected from the group consisting of

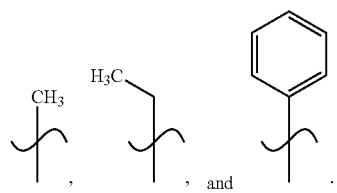

14. The method of claim 1, wherein the composition further comprises an organic crosslinking agent.

15. The method of claim 1, wherein the second polymer is a polysilsesquioxane having end groups selected from the group consisting of silanol, halosilane, acetoxysilane, silylamine, and alkoxysilane.

16. The method of claim 1, wherein m and n are in a range from 1 to about 5000.

17. The method of claim 1, wherein the resist composition further comprises an amine base.

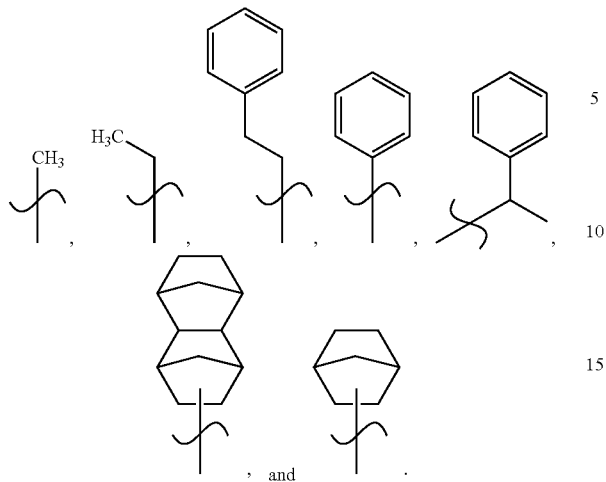

12. The method of claim 1, wherein the second polymer is configured to undergo chemical crosslinking with the first polymer, the second polymer, or a combination thereof.

* * * * *